(12) United States Patent
Wang

(10) Patent No.: US 9,390,882 B2
(45) Date of Patent: Jul. 12, 2016

(54) APPARATUS HAVING A MAGNETIC LENS CONFIGURED TO DIVERGE AN ELECTRON BEAM

(71) Applicant: Micron Technology, Inc., Boise, ID (US)

(72) Inventor: Shixin Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 48 days.

(21) Appl. No.: 14/171,357

(22) Filed: Feb. 3, 2014

(65) Prior Publication Data

US 2014/0145089 A1 May 29, 2014

Related U.S. Application Data

(62) Division of application No. 11/926,791, filed on Oct. 29, 2007, now Pat. No. 8,642,959.

(51) Int. Cl.
| | |
|---|---|
| *H01J 47/00* | (2006.01) |
| *H01J 37/14* | (2006.01) |
| *H01J 37/09* | (2006.01) |
| *H01J 37/153* | (2006.01) |
| *H01J 37/28* | (2006.01) |
| *H01J 29/64* | (2006.01) |

(52) U.S. Cl.
CPC .............. *H01J 37/14* (2013.01); *H01J 29/64* (2013.01); *H01J 37/09* (2013.01); *H01J 37/153* (2013.01); *H01J 37/28* (2013.01); *H01J 2237/045* (2013.01); *H01J 2237/0492* (2013.01); *H01J 2237/103* (2013.01); *H01J 2237/1405* (2013.01); *H01J 2237/1534* (2013.01)

(58) Field of Classification Search
None
See application file for complete search history.

(56) References Cited

U.S. PATENT DOCUMENTS

| | | | |
|---|---|---|---|
| 2,991,391 A | 7/1961 | Weaver | |
| 3,889,114 A * | 6/1975 | Jan van Oostrum | H01J 37/265 250/306 |
| 3,949,221 A * | 4/1976 | Liebl | H01J 49/32 250/281 |
| 4,099,055 A * | 7/1978 | Todokoro | H01J 37/224 250/311 |
| 4,209,698 A | 6/1980 | Hoppe | |
| 4,214,162 A * | 7/1980 | Hoppe | H01J 37/04 250/311 |
| 4,330,709 A | 5/1982 | de Chambost | |

(Continued)

FOREIGN PATENT DOCUMENTS

| | | |
|---|---|---|
| EP | 1526563 | 4/2005 |
| EP | 1526563 | 4/2006 |

(Continued)

OTHER PUBLICATIONS

Hiroshi Fujita, "Ultra-High Voltage Electron Microscopy: Past, Present, and Future," Journal of Electron Microscopy Technique 3:243-304 (1986), Alan R. Liss, Inc.

(Continued)

*Primary Examiner* — Andrew Smyth
(74) *Attorney, Agent, or Firm* — Dicke, Billig & Czaja, PLLC

(57) ABSTRACT

Apparatus having a magnetic lens configured to diverge an electron beam are useful in three-dimensional imaging using an electron microscope. The magnetic lens includes a body member having a core and defining a gap, and a winding surrounding a portion of the core. The body member and winding are configured such that an electrical current through the winding produces a magnetic field proximate to the gap.

22 Claims, 4 Drawing Sheets

(56) References Cited

U.S. PATENT DOCUMENTS

| | | | | |
|---|---|---|---|---|
| 4,352,015 A * | 9/1982 | Jore | H01J 37/09 | 250/311 |
| 4,427,886 A * | 1/1984 | Martin | H01J 37/073 | 250/310 |
| 4,482,843 A * | 11/1984 | Perring | H01J 25/025 | 315/3 |
| 4,608,491 A * | 8/1986 | Kokubo | H01J 37/153 | 250/311 |
| 4,870,321 A * | 9/1989 | Kamohara | H01J 29/51 | 313/414 |
| 4,945,237 A * | 7/1990 | Shii | H01J 37/265 | 250/307 |
| 5,081,354 A * | 1/1992 | Ohhashi | H01J 37/265 | 250/306 |
| 5,124,556 A | 6/1992 | Takashima | | |
| 5,162,695 A * | 11/1992 | Shimona | H01J 29/503 | 313/412 |
| 5,187,371 A * | 2/1993 | Matsui | H01J 37/12 | 250/396 R |
| 5,225,676 A * | 7/1993 | Matsuya | H01J 37/28 | 250/311 |
| 5,298,757 A | 3/1994 | Okayama | | |
| 5,336,891 A | 8/1994 | Crewe | | |
| 5,412,277 A * | 5/1995 | Chen | H01J 29/628 | 313/412 |
| 5,500,527 A * | 3/1996 | Zarubin | H01J 37/265 | 250/311 |
| 5,834,783 A * | 11/1998 | Muraki | B82Y 10/00 | 250/396 R |
| 6,000,981 A | 12/1999 | Knox et al. | | |
| 6,064,071 A | 5/2000 | Nakasuji | | |
| 6,384,412 B1 | 5/2002 | Krahl et al. | | |
| 6,410,923 B1 | 6/2002 | Crewe | | |
| 6,498,348 B2 | 12/2002 | Aitken | | |
| 6,570,163 B1 * | 5/2003 | El Gomati | H01J 37/244 | 250/397 |
| 6,583,413 B1 * | 6/2003 | Shinada | G01N 23/225 | 250/306 |
| 6,836,373 B2 | 12/2004 | Hosokawa | | |
| 6,878,936 B2 | 4/2005 | Kienzle et al. | | |
| 7,002,160 B1 | 2/2006 | Glass et al. | | |
| 7,005,658 B2 | 2/2006 | Muraki | | |
| 7,034,271 B1 * | 4/2006 | Sinclair | G02B 21/18 | 250/201.3 |
| 7,075,078 B2 | 7/2006 | Ose et al. | | |
| 7,109,493 B2 | 9/2006 | Eastham | | |
| 7,173,243 B1 | 2/2007 | Yang et al. | | |
| 7,233,384 B2 * | 6/2007 | Venema | G03F 7/70291 | 355/53 |
| 7,244,949 B2 | 7/2007 | Knippelmeyer et al. | | |
| 2002/0053638 A1 * | 5/2002 | Winkler | H01J 37/026 | 250/306 |
| 2003/0122087 A1 | 7/2003 | Muraki et al. | | |
| 2003/0132383 A1 | 7/2003 | Benner | | |
| 2003/0168606 A1 | 9/2003 | Adamec et al. | | |
| 2004/0081283 A1 | 4/2004 | Rand | | |
| 2004/0211919 A1 | 10/2004 | Tanaka et al. | | |
| 2005/0035290 A1 | 2/2005 | Saitoh | | |
| 2005/0116180 A1 | 6/2005 | Komagata | | |
| 2005/0199827 A1 | 9/2005 | Nagano | | |
| 2005/0236570 A1 * | 10/2005 | Morokuma | H01J 37/153 | 250/311 |
| 2005/0259786 A1 * | 11/2005 | Fantini | A61N 5/10 | 378/65 |
| 2006/0001349 A1 * | 1/2006 | Ishihara | H01J 29/488 | 313/414 |
| 2006/0071166 A1 | 4/2006 | Sato et al. | | |
| 2006/0169910 A1 | 8/2006 | Frosien et al. | | |
| 2006/0175548 A1 | 8/2006 | Kawasaki et al. | | |
| 2006/0185424 A1 | 8/2006 | Muckenhirn | | |
| 2006/0219912 A1 | 10/2006 | Ohtaki et al. | | |
| 2006/0219918 A1 | 10/2006 | Ezumi et al. | | |
| 2006/0226359 A1 | 10/2006 | Principe | | |
| 2006/0284084 A1 | 12/2006 | Morimoto et al. | | |
| 2006/0284088 A1 | 12/2006 | Fukunaga et al. | | |
| 2006/0284093 A1 | 12/2006 | Kamiya et al. | | |
| 2006/0289804 A1 | 12/2006 | Knippelmeyer et al. | | |
| 2007/0085020 A1 | 4/2007 | Kawada et al. | | |
| 2007/0090288 A1 | 4/2007 | Shemesh | | |
| 2007/0114403 A1 | 5/2007 | Hosokawa | | |
| 2007/0115468 A1 | 5/2007 | Barnard | | |
| 2007/0120065 A1 | 5/2007 | Takane et al. | | |
| 2007/0145267 A1 | 6/2007 | Adler et al. | | |
| 2007/0158567 A1 | 7/2007 | Nakamura et al. | | |
| 2007/0158568 A1 | 7/2007 | Nakamura et al. | | |
| 2007/0158576 A1 | 7/2007 | Kamikubo et al. | | |
| 2007/0176114 A1 | 8/2007 | Horsky et al. | | |
| 2007/0181805 A1 | 8/2007 | Mori et al. | | |
| 2007/0187598 A1 | 8/2007 | Tachibana et al. | | |
| 2007/0187599 A1 | 8/2007 | Abe et al. | | |
| 2007/0200069 A1 | 8/2007 | Frosien et al. | | |
| 2008/0067378 A1 * | 3/2008 | Kawasaki | H01J 37/153 | 250/310 |
| 2009/0127473 A1 * | 5/2009 | Kimura | B82Y 10/00 | 250/396 R |

FOREIGN PATENT DOCUMENTS

| | | | |
|---|---|---|---|
| GB | 665094 | | 1/1952 |
| JP | 10275580 | | 10/1998 |
| JP | 10275580 A | * | 10/1998 |
| JP | 2000294184 | | 10/2000 |
| JP | 2000294184 A | * | 10/2000 |
| JP | 2000-331797 | | 11/2000 |
| JP | 2002-110400 | | 4/2002 |
| JP | 2002-299217 | | 10/2002 |
| JP | 2006-012822 | | 1/2006 |
| JP | 2006-173027 | | 6/2006 |
| JP | 2006-278069 | | 10/2006 |
| JP | 2006-287013 | | 10/2006 |
| JP | 2007-012544 | | 1/2007 |
| JP | 2007-095576 | | 4/2007 |
| JP | 2007-134229 | | 5/2007 |
| WO | 2005008717 | | 1/2005 |

OTHER PUBLICATIONS

M. Hibino, H, Shimoyama, and S. Maruse, "A High-Voltage Scanning Transmission Electron Microscope at Nagoya University," Journal of Electron Microscopy Technique 12:296-304 (1989), Alan R Liss, Inc.

E. Munro, X. Zhu, M.R. Smith, S.R. Desbruslais and J.A Rouse, "Field Computation Techniques in Electron Optics", IEEE Transactions on Magnetics, vol. 26, No. 2, Mar. 1990.

S.K. Guharay, J. Orloff, Fellow, IEEE, and M. Wada, "Ion Beams and Their Applications in High-Resolution Probe Formation," IEEE Transactions on Plasma Science, vol. 33. No. 6, Dec. 2005.

B.L. Militsyn, C.A.J. Van Der Geer, W.H. Urbanus, "Transport of Electron Beams With Large Energy Spread in a Periodic Longitudinal Magnetic Field" Institute of Plasma Physics "Rijnhuizen", Trilateral Euregio Cluster, Association Euroaton-FOM, P.O. Box 1207, NL-34306E Nieuwegein, The Netherlands; Proceedings of EPAC 2000, Viena, Austria.

Michiko G. Minty and Frank Zimmermann, "Beam Techniques—Beam Control and Manipulation," Lectures given at the US Particle Accelerator School, University of Chicago and Argonne National Laboratory, Jun. 14-25, 1999.

Gordon W. Hamilton and Martha Bacal, "Physics and Applications of Charged Particle Beam Sources," IEEE Transactions on Plasma Science, vol. 19, No. 6, Dec. 1991.

* cited by examiner

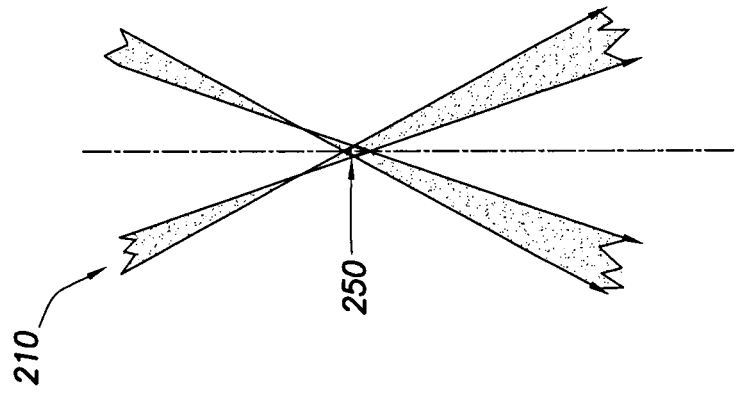
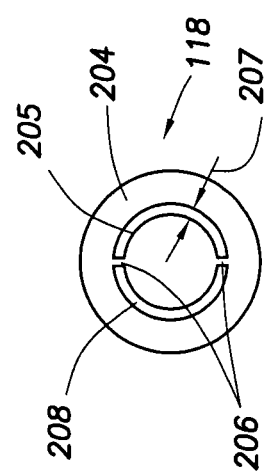
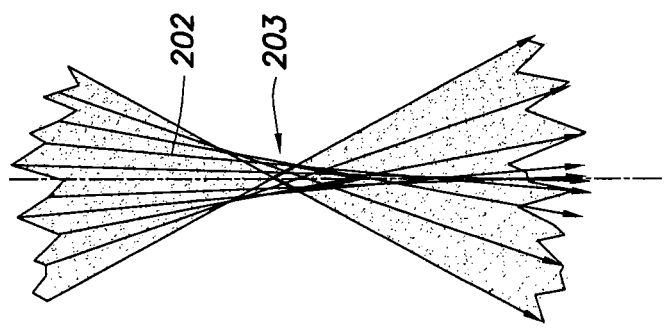

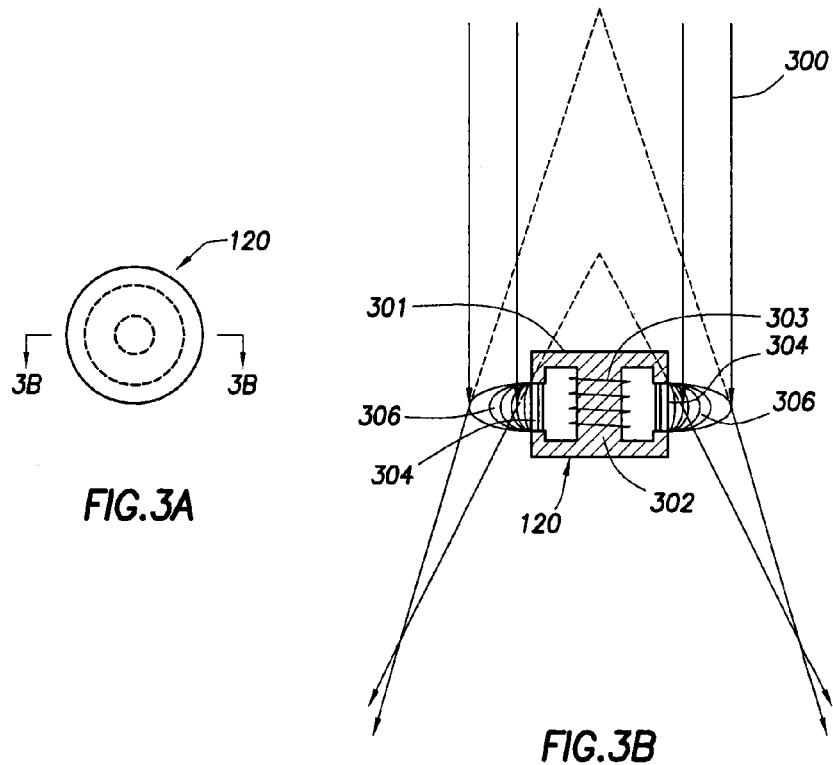
FIG.3A
FIG.3B
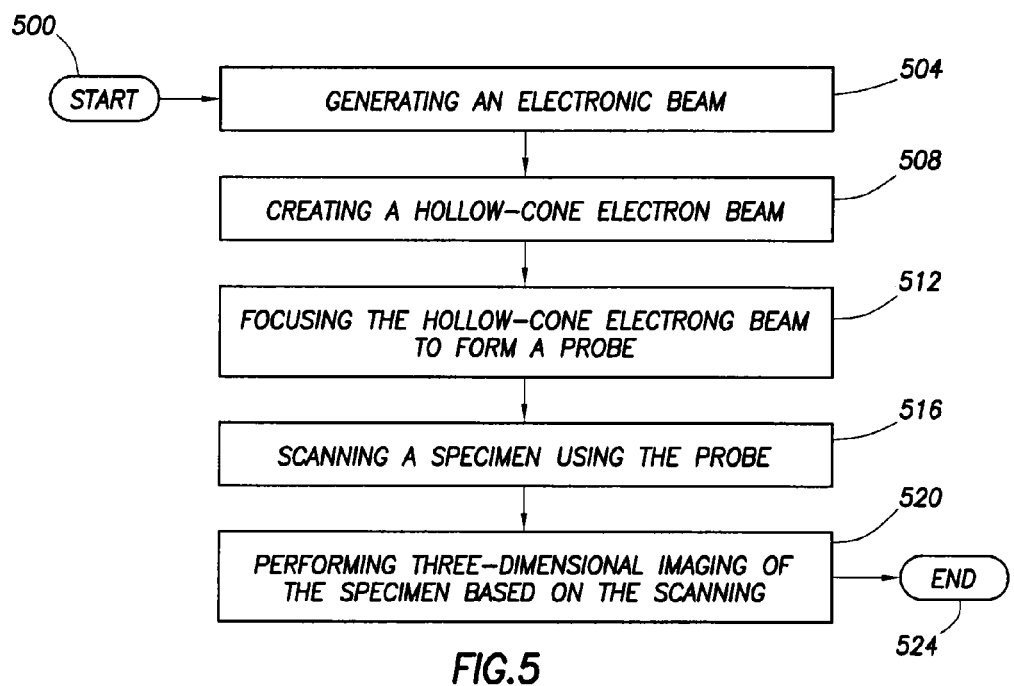
FIG.5

APPARATUS HAVING A MAGNETIC LENS CONFIGURED TO DIVERGE AN ELECTRON BEAM

RELATED APPLICATIONS

This Application is a Divisional of U.S. Application Ser. No. 11/926,791, filed Oct. 29, 2007, now U.S. Pat. No. 8,642,959, issued on Feb. 4, 2014, which is commonly assigned and incorporated herein by reference.

TECHNICAL FIELD

Various embodiments are directed to performing imaging of a specimen using an electron microscope.

BACKGROUND

Electron microscopes are used in a variety of applications that require high resolution imaging and analysis. In particular, electron microscopes are used in applications such as metallurgy, crystallography, biological sciences, and the semiconductor industry. Any technology which increases the resolution offered by electron microscopes would be desirable.

BRIEF DESCRIPTION OF THE DRAWINGS

FIG. 2A shows an electron probe;

FIG. 2B shows an annular aperture in accordance with at least some embodiments;

FIG. 2C shows an electron probe in accordance with at least some embodiments;

FIG. 3A shows a an overhead elevation view of a diverging lens in accordance with at least some embodiments;

FIG. 3B shows a cross-section elevation view of a diverging lens in accordance with at least some embodiments;

FIG. 5 shows a method in accordance with at least some embodiments.

NOTATION AND NOMENCLATURE

Certain terms are used throughout the following description and claims to refer to particular system components. As one skilled in the art will appreciate, design and manufacturing companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other intermediate devices and connections. Moreover, the term "system" means "one or more components" combined together. Thus, a system can comprise an "entire system," "subsystems" within the system, an electron microscope, a magnetic lens, or any other device comprising one or more components.

"Electron probe" refers to a volume enclosed by a substantially equal-intensity contour surface around a focus of an electron beam. One example of the intensity of the contour surface is an electron intensity substantially equal to half the electron intensity at the focus center.

"Vertical direction" refers to the direction parallel to the optical axis of an electron beam. "Horizontal direction" refers to the direction perpendicular to the optical axis of an electron beam.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
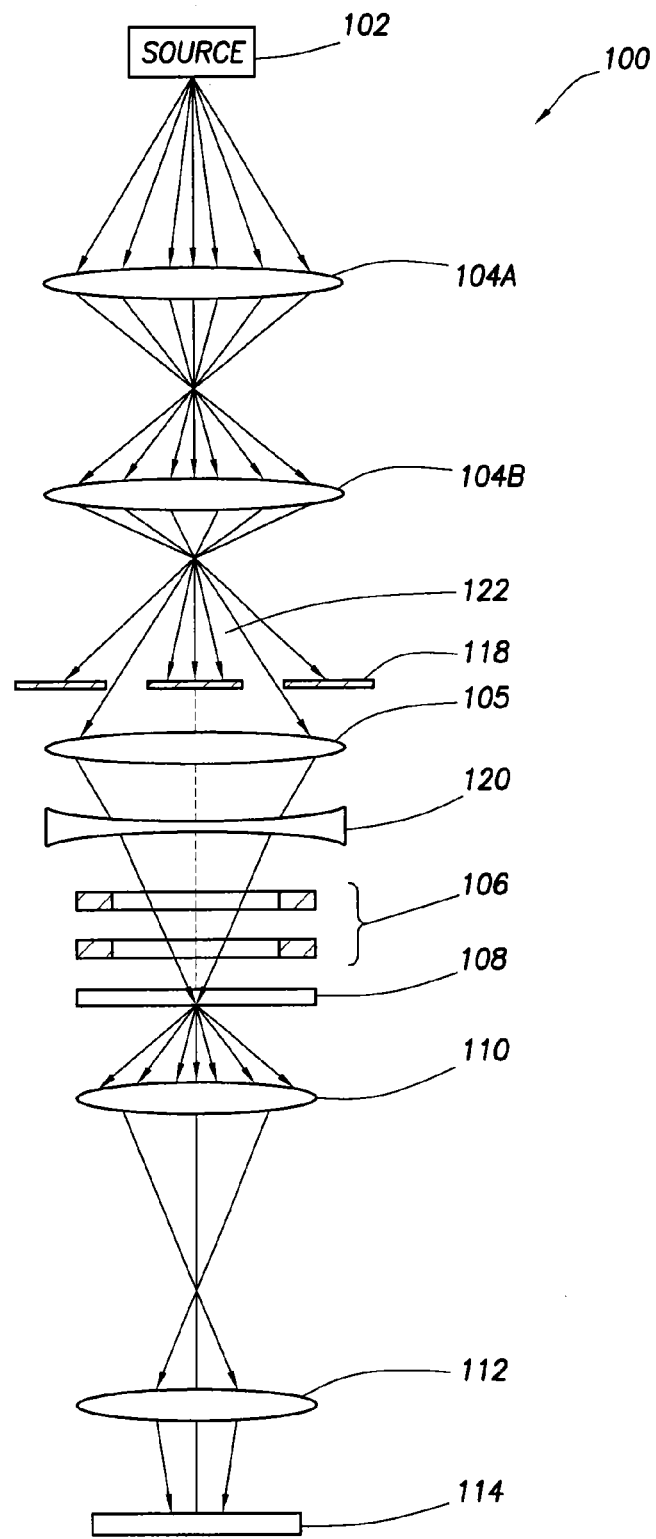
FIG. 1 shows a scanning transmission electron microscope (STEM) system in accordance with at least some embodiments.

FIG. 1 shows a system 100 in accordance with at least some embodiments. In particular, system 100 is an electron microscope (e.g., scanning transmission electron microscope (STEM)). An electron beam generated by the electron source 102 is focused onto specimen 108 using a series of converging magnetic lenses 104A-104B and 105. In the illustrative figures optical analogs of the magnetic lenses are shown for schematic purposes only. The electron source 102 accelerates the electron beam to a predetermined acceleration voltage from an electron gun (e.g. cold field emission gun or a Schottky thermally assisted field emission gun). The electron beam is focused (equivalently referred to as converged or demagnified) by passing the electron beam through a magnetic field of converging lens 104A and 104B. The electron beam is further focused by the objective lens 105 to form an electron probe. Finally, the electron probe is horizontally positioned on the specimen 108 by the beam deflection coils 106 and/or by physical positioning of the specimen 108.

The electron beam transmitted through and scattered by the specimen 108 is passed through projection lenses 110 and 112, and then detected by the detector 114. The detector 114 comprises a bright field (BF) detector and an annular dark field (ADF) detector. The BF detector detects the direct transmitted electron beam through the specimen 108, while the ADF detector detects the electron beam scattered by the specimen 108. As discussed in greater detail below, the image is acquired by scanning the specimen 108 with an electron probe using the beam deflection coils 106 and changing the strength of the condenser lens 105. A computer system (not shown in FIG. 1 so as to not to unduly complicate the figure) synchronized with the scanning of the specimen 108 forms a scanning transmitted image.

The resolution (i.e. spatial) of the system 100 is limited by the electron probe size, and the electron probe size is affected by aberration of the lenses 104A, 104B and 105. Due to aberration, the electron probe may be diffused along the longitudinal axis and the latitudinal axis of the electron beam. FIG. 2A illustrates an electron probe 203 diffused at least along the longitudinal axis of the electron beam 202. The diffusion of the electron probe 203 is caused at least in part by chromatic and/or spherical aberration of the lenses 104A, 104B and 105. In accordance with the various embodiments, the aberration of the magnetic lenses is reduced, at least in part, by annular aperture 118, resulting in an electron probe smaller than previously achievable.

FIG. 2B illustrates an overhead elevation view of annular aperture 118 in accordance with at least some embodiments. In particular, annular aperture 118 comprises an outer portion 204 and an inner portion 205. Outer portion 204 is shown in FIG. 2B as a ring; however, other shapes may be equivalently used. Likewise, inner portion 205 is shown to be circularly symmetric, but other shapes may be equivalently used. The outer portion 204 and the inner portion 205 are separated by uniform width 207 to create an opening 208 which, in this particular example, is also circularly symmetric. The outer portion 204 and the inner portion 205 are bridged (e.g., at locations 206) to prevent movement between the inner and outer portions. The annular aperture 118 is made of a heavy metal (e.g. Molybdenum, Platinum, or Tungsten) capable of blocking the electron beam, and the annular aperture 118 is grounded to prevent charge accumulation.

Referring simultaneously to FIG. 1 (which shows the annular aperture in cross-section) and 2B (which shows an overhead elevation view), in accordance with at least some embodiments annular aperture 118 is situated co-axially with the electron beam. The annular aperture 118 may be moved (i.e. by mechanical control) in the horizontal direction to align the center of the inner portion 205 of the annular aperture 118 with the optical axis of the electron beam. Annular aperture 118 enables only the portion of the electron beam incident on the opening 208 to pass, and the remaining portion of the electron beam is blocked by the outer portion 204 and inner portion 205. The result is an electron beam confined to a hollow-core or hollow-cone geometry. When focused to create an electron probe, the hollow-cone electron beam creates an electron probe with less diffusion along the longitudinal axis.

FIG. 2C illustrates a cross-sectional elevation view of a hollow-cone electron beam 210 focused to create electron probe 250. As illustrated by reference briefly to FIG. 2A, the electron probe 250 is significantly smaller than the electron probe 203 formed by a solid-cone electron beam. The smaller size of the electron probe 250 is due in part to the aberration reduction provided by the annular aperture 118, and also due in part to use of a hollow-cone electron beam enabling the electron beam to converge at larger angles (measured from the axis of the electron beam).

While in some embodiments use of the annular aperture 118 alone may significantly reduce the electron probe 250 size by reducing aberration and resultant diffusion, some aberration (and thus diffusion) may still be present. The aberration that remains may be equivalently thought of as the portion of the aberration from lenses 104A, 104B and 105 that remains after the aberration reduction by the annular aperture 118. The amount of remaining aberration is proportional to the angular range of the electron beam that passes through opening 208 of the annular aperture. Stated otherwise, the amount of remaining aberration is related to width 207 of the opening 208.

In accordance with some of the embodiments, a diverging lens 120 (FIG. 1) is used to correct at least some of the remaining aberration (and resulting diffusion). The diverging lens 120 is a magnetic lens situated co-axially with the hollow-cone electron beam at a location after the annular aperture 118 and before the specimen 108. The diverging lens 120 diverges a hollow-cone electron beam, and in the embodiments of FIG. 1 the diverging lens 120 diverges the hollow-cone electron beam prior to the beam passing through the deflection coils 106. FIG. 3A shows an overhead view of the diverging lens 120. In particular, FIG. 3A shows that the diverging lens 120 is, in some embodiments, rotationally symmetric (i.e. circular), with the portion is dashed lines illustrating internal features not actually visible in the overhead view. FIG. 3B shows a cross-sectional elevation view of the diverging lens 120 taken along line 3B-3B of FIG. 3A. In particular, the diverging lens 120 comprises a body member 301, made of soft iron (or any other ferromagnetic substance). In order to avoid charge accumulation on the metallic members of the diverging lens 120, the body member 301 may be electrically grounded. The diverging lens 120 further comprises a solid core 302 within the body member 301 (e.g., at the center of the body member 301) and with air gaps 304 defining edges. In order to create magnetic flux through the body member 301, an electrical coil 303 wound around the core 302 is excited by way of an electrical current. The electric current generates a magnetic field across the air gaps 304. Because of fringing of the magnetic field outside the of the air gaps 304, a hollow-cone electron beam 300 passing through the magnetic field 306 diverges to the outside of the lens 120, as illustrated in FIG. 3B.

The diverging lens 120, like magnetic lenses 104A-104B and 105, has inherent spherical and chromatic aberrations. As illustrated in FIG. 3B, the portion of the electron beam closest to the gaps 304 diverges more than portions of the electron beam that pass further away from the gaps 304. The spherical aberration of the diverging lens 120 is substantially opposite that of the converging magnetic lenses 104A-104B and 105, and by adjusting the strength of the magnetic field of the diverging lens 120 (i.e. by the current applied to the electrical coil 303), the spherical aberration(s) caused by lenses 104A, 104B and 105 may be substantially cancelled by the diverging lens 120. Likewise, chromatic aberration in the diverging lens 120 cancels with the chromatic aberration of the magnetic lenses 104A-104B and 105.

Returning to FIG. 1, the resolution of the system 100 is controlled, at least in part, by the electron probe size, and the electron probe size is limited by the aberrations of the magnetic lens. The electron probe formed by system 100 has small horizontal and vertical dimensions, as the aberrations are limited and/or corrected by the annular aperture 118 and the diverging lens 120. As a result, the system 100 is capable of performing high resolution three-dimensional imaging by scanning the specimen 108 with the electron probe in both horizontal and vertical directions.

The scanning of the specimen 108 with the electron probe is controlled by the objective lens 105 and the beam deflector coils 106. In particular, changing the strength of the deflector coils 106 enables scanning of the specimen 108 in the horizontal direction, and changing the strength of the objective lens 105 enables scanning of the specimen 108 in the vertical direction (i.e. through its thickness). The detector 114 detects the electron beams transmitted through and/or scattered by scanning the specimen 108 with the electron probe.

Figure 4:
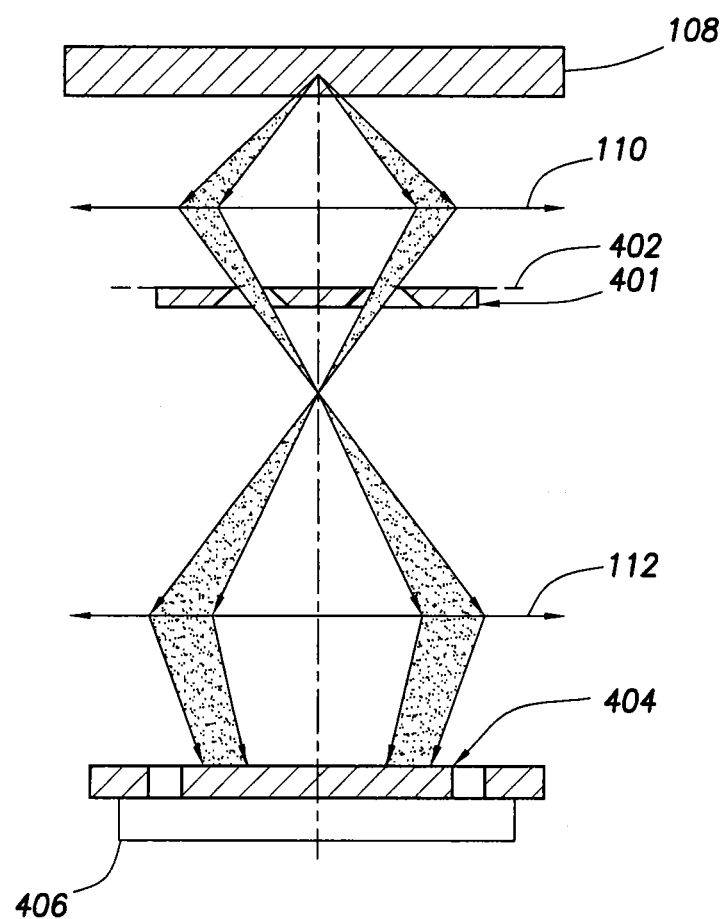
FIG. 4 shows a partial STEM system in accordance with at least some embodiments.

In FIG. 1, the electron beam passes through specimen 108, through the projection lenses 110 and 112, and then to the detector 114. In other embodiments, the electron beam may pass through further annular apertures before being incident upon the detector. FIG. 4 shows such other embodiments for detecting the direct transmitted electron beam and the scattered electron beams by the detector 114. In particular, FIG. 4 shows an annular aperture 401 situated substantially at the back focal plane 402 between the post-field objective lens 110 and projection lens 112. The annular aperture 401 blocks the scattered electron to provide a filtered image at the bright field detector 404. In yet another embodiment, the annular aperture 401 blocks the direct transmitted electron beams to provide a cleaner image at the annular dark field detector 406.

FIG. 5 shows a method in accordance with at least some embodiments. In particular, the method starts (block 500) and moves to generating an electron beam (block 504). Next, a hollow-cone electron beam is created (block 508) by passing the electron beam through a annular aperture. Thereafter, the hollow-cone electron beam is focused to form a probe (block 512). Next, a specimen is scanned using the probe (block 516). Finally, three-dimensional imaging is performed based on the scanning (block 520), and the method ends (block 524).

The above discussion is meant to be illustrative of the principles and various embodiments of the present invention. Numerous variations and modifications will become apparent to those skilled in the art once the above disclosure is fully appreciated. For example, the three-dimensional imaging may be performed using a scanning transmission electron microscope, or the three-dimensional imaging maybe performed with any other types of electron microscope (e.g. scanning electron microscope (SEM)). Moreover, the various embodiments are discussed with both the annular aperture and diverging lens; however, in other embodiments the annular aperture may be used without the diverging lens. Finally, while in the various embodiments discussed the three-dimensional imaging of a specimen, in other embodiments three-dimensional electron energy loss spectroscopy (EELS) analysis of a specimen may be performed. Finally, the figures illustrate only one annular aperture situated in the electron microscope prior to specimen; however, in other embodiments additional annular apertures may be situated in the electron beam prior to the specimen as well. It is intended that the following claims be interpreted to embrace all such variations and modifications.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. An apparatus comprising:
    a magnetic lens configured to diverge an electron beam, the magnetic lens comprising:
        a body member comprising a solid cylindrical core within the body member, and defining a gap surrounding the solid cylindrical core; and
        a winding within the body member and surrounding a portion of the solid cylindrical core;
    wherein the body member and winding are configured such that an electrical current through the winding produces a magnetic field proximate to the gap; and
    wherein the solid cylindrical core is solid extending from an axis of the solid cylindrical core to an outer radius of the solid cylindrical core.

2. The apparatus of claim 1, wherein the body member is a rotationally symmetric body member.

3. The apparatus of claim 2, wherein the rotationally symmetric body member is a circular body member.

4. The apparatus of claim 1, wherein the solid cylindrical core is centered within the body member.

5. The apparatus of claim 1, wherein the gap is parallel to the longitudinal axis of the electron beam.

6. The apparatus of claim 1, wherein the magnetic lens is configured to be placed co-axially to the electron beam.

7. The apparatus of claim 1, wherein the magnetic lens is configured to correct spherical and chromatic aberrations.

8. The apparatus of claim 1, wherein the magnetic lens is configured to diverge a hollow-cone electron beam.

9. The apparatus of claim 1, wherein the body member comprises a ferromagnetic substance.

10. The apparatus of claim 1, wherein the ferromagnetic substance comprises iron.

11. The apparatus of claim 1, wherein the body member is electrically grounded.

12. The apparatus of claim 1, wherein the gap is an air gap.

13. An apparatus comprising:
    a magnetic lens configured to diverge a hollow-cone electron beam around an exterior of the magnetic lens at a particular radius from a center of the magnetic lens, the magnetic lens comprising:
        a ferromagnetic body member comprising a ferromagnetic core and defining a gap surrounding the ferromagnetic core at the particular radius of the magnetic lens; and
        an electrical coil wound around the ferromagnetic core and contained between the particular radius of the magnetic lens and the ferromagnetic core;
    wherein the ferromagnetic body member and the electrical coil wound around the ferromagnetic core are configured such that an electrical current through the electrical coil produces a magnetic field proximate to the gap; and
    wherein the hollow-cone electron beam does not travel through the core.

14. The apparatus of claim 13, wherein the body member is a rotationally symmetric body member, and wherein the core is centered within the rotationally symmetric body member.

15. The apparatus of claim 13, wherein the gap is parallel to the longitudinal axis of the electron beam.

16. The apparatus of claim 13, wherein the ferromagnetic body member comprises iron.

17. The apparatus of claim 13, wherein the body member is electrically grounded.

18. An apparatus comprising:
    a magnetic lens configured to diverge an electron beam placed co-axially to the magnetic lens, the magnetic lens comprising:
        a rotationally symmetric body member comprising a core having an outer radius, and defining a gap between two annular portions of the rotationally symmetric body member, the two annular portions having inner and outer radii each greater than the outer radius of the core; and
        a winding surrounding a portion of the core and located within the rotationally symmetric body member in a space between the outer radius of the core and the inner radius of each of the two annular portions;
    wherein the rotationally symmetric body member is configured to be placed co-axially to the electron beam; and
    wherein the rotationally symmetric body member and winding are configured such that an electrical current through the winding produces a magnetic field proximate to the gap; and
    wherein the electron beam does not travel through the core.

19. The apparatus of claim 18, wherein the core is centered within the rotationally symmetric body member.

20. The apparatus of claim 18, wherein the magnetic lens is configured to diverge a hollow-cone electron beam placed co-axially to the magnetic lens.

21. The apparatus of claim 18, wherein the body member comprises a ferromagnetic substance.

22. The apparatus of claim 18, wherein the body member is electrically grounded.

* * * * *